(12) United States Patent
Iwai et al.

(10) Patent No.: US 9,941,442 B2
(45) Date of Patent: Apr. 10, 2018

(54) GROUP 13 ELEMENT NITRIDE CRYSTAL SUBSTRATE AND FUNCTION ELEMENT

(71) Applicant: NGK INSULATORS, LTD., Nagoya, Aichi-prefecture (JP)

(72) Inventors: Makoto Iwai, Kasugai (JP); Takashi Yoshino, Ama (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 15/609,553

(22) Filed: May 31, 2017

(65) Prior Publication Data

US 2017/0263815 A1  Sep. 14, 2017

Related U.S. Application Data

(63) Continuation of application No. PCT/JP2015/083529, filed on Nov. 30, 2015.

(30) Foreign Application Priority Data

Dec. 1, 2014 (JP) .................. 2014-243135

(51) Int. Cl.
*H01L 33/14* (2010.01)
*C30B 19/02* (2006.01)
(Continued)

(52) U.S. Cl.
CPC .............. *H01L 33/14* (2013.01); *C30B 19/02* (2013.01); *C30B 25/18* (2013.01); *C30B 25/20* (2013.01);
(Continued)

(58) Field of Classification Search
None
See application file for complete search history.

(56) References Cited

U.S. PATENT DOCUMENTS

| 6,924,159 B2 | 8/2005 | Usui et al. |
| 8,207,054 B2 | 6/2012 | Shibata |
| 2008/0308906 A1* | 12/2008 | Osada ..................... C30B 25/02 257/615 |

FOREIGN PATENT DOCUMENTS

| EP | 1296362 B1 | 5/2010 |
| JP | 3631724 B2 | 12/2004 |

(Continued)

OTHER PUBLICATIONS

Motoki, K., "Development of GaN substrates," SEI technical review, Jul. 2009, No. 175, pp. 10-18.
(Continued)

*Primary Examiner* — Daniel Whalen
(74) *Attorney, Agent, or Firm* — Cermak Nakajima & McGowan LLP; Tomoko Nakajima (57) ABSTRACT

A crystal substrate is composed of a crystal of a nitride of a group 13 element and has a first main face and a second main face. The crystal substrate includes a low carrier concentration region and a high carrier concentration region both extending between the first main face and second main face. The low carrier concentration region has a carrier concentration of $10^{18}/cm^3$ or lower and a defect density of $10^7/cm^2$ or lower. The high carrier concentration region has a carrier concentration of $10^{19}/cm^3$ or higher and a defect density of $10^8/cm^2$ or higher.

12 Claims, 2 Drawing Sheets

(51) Int. Cl.
*C30B 25/20* (2006.01)
*C30B 29/38* (2006.01)
*C30B 25/18* (2006.01)
*C30B 29/40* (2006.01)
*H01L 33/02* (2010.01)
*H01L 33/32* (2010.01)
*H01L 33/42* (2010.01)
*H01S 5/02* (2006.01)
*H01L 33/06* (2010.01)
*H01L 33/00* (2010.01)
*H01S 5/323* (2006.01)
*H01S 5/343* (2006.01)

(52) U.S. Cl.
CPC ............ *C30B 29/38* (2013.01); *C30B 29/406* (2013.01); *H01L 33/0075* (2013.01); *H01L 33/025* (2013.01); *H01L 33/32* (2013.01); *H01L 33/42* (2013.01); *H01S 5/0206* (2013.01); *H01L 33/007* (2013.01); *H01L 33/0079* (2013.01); *H01L 33/06* (2013.01); *H01S 5/32341* (2013.01); *H01S 5/34333* (2013.01)

(56) References Cited

FOREIGN PATENT DOCUMENTS

| | | |
|---|---|---|
| JP | 2006-117530 A | 5/2006 |
| JP | 3801125 B2 | 5/2006 |
| JP | 2008-060519 A | 3/2008 |
| JP | 2009-012986 A | 1/2009 |
| JP | 4396816 B2 | 10/2009 |
| JP | 2014-088272 A | 5/2014 |
| WO | WO2013/058352 A1 | 4/2013 |

OTHER PUBLICATIONS

International Search Report and Written Opinion for PCT Patent App. No. PCT/JP2015/083529 (dated Jan. 12, 2016) with English language translation of the ISR.

International Preliminary Report on Patentability for PCT Patent App. No. PCT/JP2015/083529 (dated Jun. 15, 2017).

\* cited by examiner

GROUP 13 ELEMENT NITRIDE CRYSTAL SUBSTRATE AND FUNCTION ELEMENT

TECHNICAL FIELD

The present invention relates to a substrate of a crystal of a group 13 nitride and a functional device utilizing the same. For example, the present invention may be used in technical fields requiring high quality, such as a white LED with improved color rendering index and expected as a future substitute of a luminescent lamp, a blue-violet laser for high-speed and high-density optical memory, an LED for a head light, a power device for an inverter for a hybrid car or the like.

RELATED ART STATEMENT

As white LED's are widely applied, it has been required improved performances for the LED chips. The improved performances mean improved efficiency and luminance. HVPE method is well known as a method of obtaining self-supporting substrate of gallium nitride. Among them, as methods of obtaining crystals of high quality, DEEP method (patent document 1 and non-patent document 1) or VAS method (patent documents 2 and 3) are disclosed.

Flux method is a kind of liquid phase methods. In the case of gallium nitride, by using sodium metal as flux, it is possible to reduce a temperature and pressure required for crystal growth of gallium nitride to about 800° C. and several MPa, respectively. Specifically, nitrogen gas is dissolved into mixed melt of sodium metal and gallium metal, so that gallium nitride becomes supersaturation state and grows as a crystal. According to such liquid phase process, dislocations are reduced than that in the case of vapor phase process, so that it is possible to obtain gallium nitride of high quality and having a lower dislocation density (Patent document 4).

RELATED DOCUMENTS (Non-patent document 1) SEI technical review 2009, July, vol. 175, pages 10 to 18, "Development of gallium substrate"
(Patent document 1) Japanese patent No. 3801125B1
(Patent document 2) Japanese patent No. 3631724B1
(Patent document 3) Japanese patent No. 4396816B1
(Patent document 4) Japanese patent publication No. 2009-012986A1

SUMMARY OF THE INVENTION

It is necessary to make the conductivity of a nitride crystal layer of a group 13 element, for producing LED's and laser diodes. For this, the inventors have tried to dope a dopant, such as Si or oxygen, into the crystal layer, so that the conductivity of the crystal layer and its output power are improved.

However, even if the amount of the dopant is actually increased, there were cases that a desired output power of emitted light could not be obtained. In particular, in the case of so-called vertical type light-emitting devices, the luminous intensity may not be improved even in the case that its driving voltage is raised beyond some degree.

An object of the present invention is, in a substrate of a crystal of a nitride of a group 13 element, to obtain desired conductivity and to effectively utilize the conductivity of the crystal of the nitride of the 13 group element to improve its function.

The present invention provides a crystal substrate comprising a crystal of a nitride of a group 13 element and having a first main face and a second main face:

wherein said crystal substrate comprises a low carrier concentration region and a high carrier concentration region both extending between said first main face and said second main face;

wherein said low carrier concentration region has a carrier concentration of $10^{18}/cm^3$ or lower;

wherein said low carrier concentration region has a defect density of $10^7/cm^2$ or lower;

wherein said high carrier concentration region has a carrier concentration of $10^{19}/cm^3$ or higher; and wherein said high carrier concentration region has a defect density of $10^8/cm^2$ or higher.

The present invention further provides a device comprising:

the crystal substrate; and a functional layer comprising a nitride of a group 13 element and formed on the crystal substrate.

For example, in the case that LED's or laser diodes are produced, a high conductivity is required. However, for providing the conductivity by doping a dopant, such as Si or oxygen, into the crystal of the nitride of the group 13 element, it is proved that it is difficult to dope the dopant uniformly over the whole surface of a wafer. It is considered that such unevenness of the dopant may result in current leakage.

Although the inventors have studied various measures for solving the problem of the unevenness of the dopant, it was proved that the problem was hard to solve. However, during the course of the study, it was found the followings. That is, in some kinds of crystal substrates, in a cross section of the crystal substrate, both of low carrier concentration region and high concentration region are extended from a first main face in stripe shape to a second main face to penetrate through the crystal substrate.

That is, in the case that a vertical type LED is formed on the crystal substrate having such cross sectional structure, the phenomenon occurred that the luminous intensity could not be improved due to the current leakage even when the voltage is raised above a certain level. Then, as the result of considering the mechanism of the current leakage, it was found the followings. That is, in a cross sectional structure of the crystal substrate of the nitride of the group 13 element, the crystallinity is deteriorated and a current easily flows in a region having a high conductivity. This results in the local concentration of current so that the current leakage occurs. That is, it was successfully confirmed that the temperature of the locations with the current leakage occurred was raised, by observing the cross section by a microscopic thermography.

It was further confirmed the followings. That is, in the cross sectional structure of the crystal substrate, the number of defects is large and the current leakage tends to occur in the relatively high carrier concentration region. In addition to this, it was confirmed that such high carrier concentration region is elongated between the upper face and bottom face of the crystal substrate to penetrate through the substrate. At the same time, it was also confirmed that the low carrier concentration region was elongated in a stripe shape between the upper and bottom faces of the crystal substrate to penetrate through the substrate.

Further, the reduction of the luminous efficiency in the case of raising the current density applied onto an LED chip has been known as efficiency droop phenomenon. Its cause was reported to be carrier overflow, non-radiative recombination, Auger recombination or the like. However, such phenomenon is mainly found in horizontal type LED's.

The above phenomenon found by the inventors is different from the efficiency droop phenomenon, has not been reported until now and newly discovered by the inventors. The local current concentration is newly discovered this time based on the observation as described above.

Based on the discovery, the inventors tried to form a light emitting device structure on the first main face of the crystal substrate described above, so that at least a pair of electrodes are provided on the first main face side of the crystal substrate to provides a so-called horizontal type light emitting device. As a result, it is found that the current leakage described above was prevented and a relatively high luminous intensity can be obtained. The present invention is thus made.

It is thus possible to prevent the current leakage in the case that the voltage applied on the crystal substrate is raised, so that the conductivity of the crystal substrate can be effectively utilized and the function can be further improved.

BRIEF DESCRIPTION OF THE DRAWINGS

FIG. 2 (a) shows the state that a seed crystal film 8 is provided on a supporting body 7, and FIG. 2 (b) shows the state that the crystal substrate 1 composed of a crystal of a nitride of a group 13 element on the seed crystal film 8.

EMBODIMENTS FOR CARRYING OUT THE INVENTION

The present invention will be described further in detail, appropriately referring to attached drawings.
(Crystal Substrate)

Figure 1A:
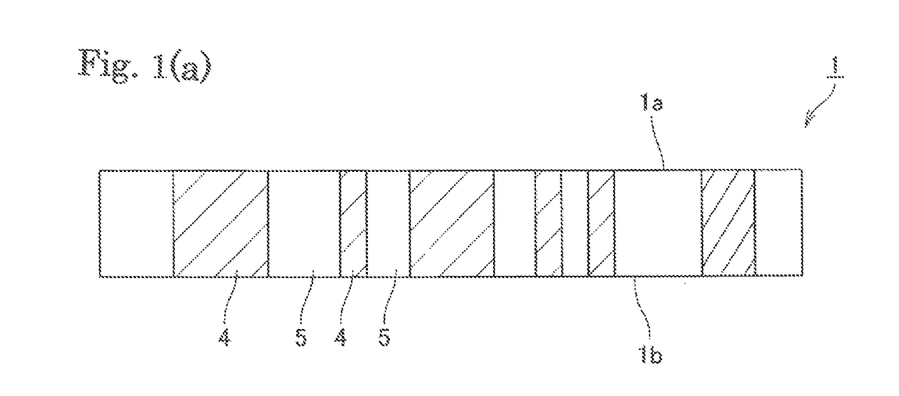
FIG. 1(a) is a view schematically showing a crystal substrate 1 according to an embodiment of the present invention.
Figure 1B:
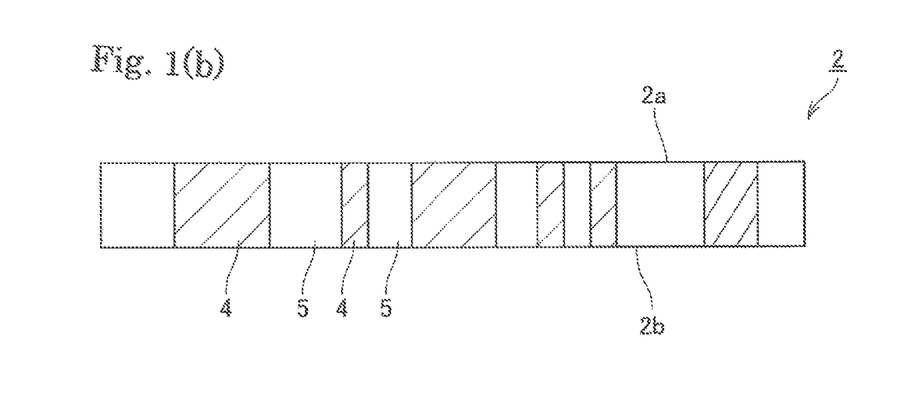
FIG. 1(b) is a view schematically showing a crystal substrate 2 according to another embodiment.

According to a preferred embodiment, as shown in FIGS. 1(a) and 1(b), it is provided crystal substrates 1 and 2 each composed of a nitride of the group 13 element. Each of the crystal substrates 1 and 2 includes low carrier concentration regions 4 and high carrier concentration regions 5 each extending between a first main face 1a or 2a and a second main face 1b or 2b. It is confirmed that each of the region 4 and 5 is generated to extend through the substrate between the first and second main faces.

Here, the low carrier concentration region 4 has a carrier concentration of $10^{18}/cm^3$ or lower, and the low carrier concentration region 4 has a defect density of $10^7/cm^2$ or lower. Further, the high carrier concentration region has a carrier concentration of $10^{19}/cm^3$ or higher, and the high carrier concentration region has a defect density of $10^8/cm^2$ or higher. It is found the followings. That is, according to the mechanism described above, the dopants are concentrated in the high carrier concentration region so that its carrier concentration is raised, defects are also concentrated into the same region, which is elongated to extend between the main faces of the crystal substrate.

Here, the low carrier concentration region may preferably have a carrier concentration of $5 \times 10^{17}/cm^3$ or lower. Further, in the crystal substrate including the high carrier concentration region described above, the carrier concentration of the low carrier concentration region may be $1 \times 10^{16}/cm^3$ or higher in many cases. Further, the defect density of the low carrier concentration region may preferably be $5 \times 10^6/cm^2$ or lower. Further, the defect density of the low carrier concentration region may be $1 \times 10^6/cm^2$ or higher in many cases.

Further, the carrier concentration of the high carrier concentration region is $10^{19}/cm^3$ or higher and may preferably be $2 \times 10^{19}/cm^3$ or higher. Further, in the crystal substrate including the low carrier concentration region described above, the carrier concentration of the high carrier concentration region may be $1 \times 10^{20}/cm^3$ or lower in many cases. Further, the defect density of the high carrier concentration region may preferably be $1 \times 10^9/cm^2$ or lower.

Here, in the case that the dopant is an n-type dopant (such as Si, Ge, oxygen or the like), the activation ratio is as high as 98 percent or higher. The dopant concentration can be deemed as the carrier concentration. The carrier concentration will be described below on the viewpoint of the present invention for preventing leakage due to the current concentration. However, the activation ratio can be deemed as 100 percent and the carrier concentration can be read as the dopant concentration.

According to the present invention, the high carrier concentration region and low concentration region are measured and distinguished as follows.

It is used a system of measuring cathode luminescence (for example, MP series supplied by HORIBA, Ltd.) at a magnitude of 50 to 500 fold and in a rectangular region of taking an image of 0.1 mm and 1 mm.

The carrier concentration and defect density are to be measured according to the method and conditions described in the Examples section.

The material of the crystal substrate is a nitride of a group 13 element according to the Periodic Table determined by IUPAC. The group 13 element is specifically gallium, aluminum, indium, thallium or the like. The nitride of the group 13 element may preferably be gallium nitride, aluminum nitride or gallium aluminum nitride. Further, as an additive, it may be listed carbon, a metal having a low melting point (tin, bismuth, silver, gold), and a metal having a high melting point (a transition metal such as iron, manganese, titanium, chromium).

The thickness of the crystal substrate may preferably be 250 µm or larger and more preferably be 300 µm or larger, on the viewpoint of the handling. Further, the thickness of the crystal substrate may preferably be 450 µm or smaller, on the viewpoint of economy and conductivity.

(Functional Layer and Functional Device)

A functional layer may be formed on the crystal substrate to obtain a functional device.

The functional layer as described above may be composed of a single layer or a plurality of layers. Further, as the functions, it may be used as a white LED with high brightness and improved color rendering index, a blue-violet laser disk for high-speed and high-density optical memory, a power device for an inverter for a hybrid car or the like.

As a semiconductor light emitting diode (LED) is produced on the crystal substrate by a vapor phase process, preferably by metal organic vapor phase deposition (MOCVD) method, the dislocation density inside of the LED can be made comparable with that of the crystal substrate.

The film-forming temperature of the functional layer may preferably be 950° C. or higher, and more preferably be 1000° C. or higher, on the viewpoint of inhibiting the incorporation of impurities such as carbon. Further, on the viewpoint of preventing defects, the film-forming tempera- ture of the functional layer may preferably be 1200° C. or lower and more preferably be 1150° C. or lower.

The material of the functional layer may preferably be a nitride of a group 13 element. Group 13 element means group 13 element according to the Periodic Table determined by IUPAC. The group 13 element is specifically gallium, aluminum, indium, thallium or the like.

The light emitting device structure includes, an n-type semiconductor layer, a light emitting region provided on the n-type semiconductor layer and a p-type semiconductor layer provided on the light emitting region, for example. Further, the light emitting structure described above may preferably further include an electrode for the n-type semiconductor layer, an electrode for the p-type semiconductor layer, a conductive adhesive layer, a buffer layer and a conductive supporting body or the like not shown.

According to the light emitting structure, as light is emitted in the light emitting region through re-combination of holes and electrons injected through the semiconductor layers, the light is drawn through the side of a translucent electrode on the p-type semiconductor layer or the film of the nitride single crystal of the group 13 element. Besides, the translucent electrode means an electrode capable of transmitting light and made of a metal thin film or transparent conductive film formed substantially over the whole of the p-type semiconductor layer.

The n-type semiconductor layer or p-type semiconductor layer is composed of a semiconductor of III-V group compound semiconductor, which includes the followings.

$Al_yIn_xGa_{1-x-y}N (0 \leq x \leq 1, 0 \leq y \leq 1)$

As a dopant for imparting n-type conductivity, silicon, germanium and oxygen are listed. Further, as a dopant for imparting p-type conductivity, magnesium and zinc are listed.

The method of growing each of the semiconductor layers constituting the light emitting structure includes various kinds of vapor phase growing methods. For example, metal organic chemical vapor deposition (MOCVD; MOVPE), molecular beam epitaxy (MBE), hydride vapor phase epitaxy (HVPE) or the like may be used. Among them, it is possible to obtain semiconductor layers with good crystallinity and flatness by MOCVD method. According to MOCVD method, an alkyl metal compound such as TMG (trimethyl gallium) and TEG (triethyl gallium) or the like is used as the Ga source in many cases and a gas such as ammonia and hydrazine are used as the nitrogen source.

The light emitting region includes a quantum well active layer. The material of the quantum well active layer is designed so that the band gap is made smaller than those of the n-type and p-type semiconductor layers. The quantum well active layer may be a single quantum well active layer (SQW) structure or a multi quantum well active layer (MQW) structure. The material of the quantum well active layer includes the followings.

As a preferred example of the quantum well active layer, it is listed an MQW structure including three to ten periods of quantum well active layers each made of $Al_xGa_{1-x}/Al_yGa_{1-y}N$ (x=0.15, y=0.20) series with a film thickness of 3 nm/8 nm.

The present invention is preferred for so-called horizontal type functional device, particularly light-emitting device.

Here, the horizontal type functional device includes the inventive crystal substrate and the functional device structure on the first main face, in which at least a pair of driving electrodes are provided on the side of the first main face of the crystal substrate. Therefore, in the case that a voltage is applied between the electrodes, the electric field is applied in a direction substantially parallel with the first main face of the crystal substrate.

According to the inventive crystal substrate, the pillar-shaped high carrier concentration region and low carrier concentration region are elongated between the first and second main faces, in a three-dimensional view. When the voltage is applied in the direction parallel with the main face, the electric field passes through many high carrier concentration regions and low carrier concentration regions alternately. As a result, the leak current between the electrodes can be prevented, so as to provide the function corresponding with the applied voltage.

(Production of Crystal Substrate)

According to a preferred embodiment, the crystal substrate is formed on a seed crystal. The seed crystal may form a self-supporting substrate (supporting body) or may be a seed crystal film formed on a separate supporting body. The seed crystal film may be composed of a single layer or may include a buffer layer on the side of the supporting body.

Figure 2A:
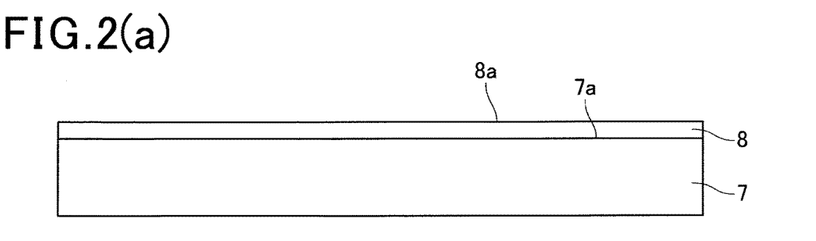

For example, as shown in FIG. 2(a), a seed crystal film 8 is formed on a surface 7a of a supporting body 7. The seed crystal film 8 is composed of a nitride of a group 13 element.

In the case that the seed crystal film is formed on the supporting body, although the single crystal forming the supporting body is not limited, it includes sapphire, AlN template, GaN template, self-supporting GaN substrate, silicon single crystal, SiC single crystal, MgO single crystal, spinel ($MgAl_2O_4$), $LiAlO_2$, $LiGaO_2$, and perovskite composite oxide such as $LaAlO_3$, $LaGaO_3$ or $NdGaO_3$ and SCAM ($ScAlMgO_4$). A cubic perovskite composite oxide represented by the composition formula $[A_{1-y}(Sr_{1-x}Ba_x)_y][(Al_{1-z}Ga_z)_{1-u}D_u]O_3$ (wherein A is a rare earth element; D is one or more element selected from the group consisting of niobium and tantalum; y=0.3 to 0.98; x=0 to 1; z=0 to 1; u=0.15 to 0.49; and x+z=0.1 to 2) may be also used.

The direction of growth of the nitride crystal layer of the group 13 element may be a direction normal to c-plane of the wurtzite structure or a direction normal to each of the a-plane and m-plane.

The dislocation density at the surface 8a of the seed crystal is preferably lower, on the viewpoint of reducing the dislocation density of the crystal substrate provided on the seed crystal. On the viewpoint, the dislocation density of the seed crystal layer may preferably be $7 \times 10^8$ cm$^{-2}$ or lower and more preferably be $5 \times 10^8$ cm$^{-2}$ or lower. Further, as the dislocation density of the seed crystal may preferably be lower on the viewpoint of the quality, the lower limit is not particularly provided, but it may generally be $5 \times 10^7$ cm$^{-2}$ or higher in many cases.

The method of forming the seed crystal film may preferably be vapor phase process, and metal organic chemical vapor deposition (MOCVD) method, hydride vapor phase epitaxy (HVPE) method, pulse-excited deposition (PXD) method, MBE method and sublimation method, and liquid phase process such as flux method, are exemplified.

Figure 2B:
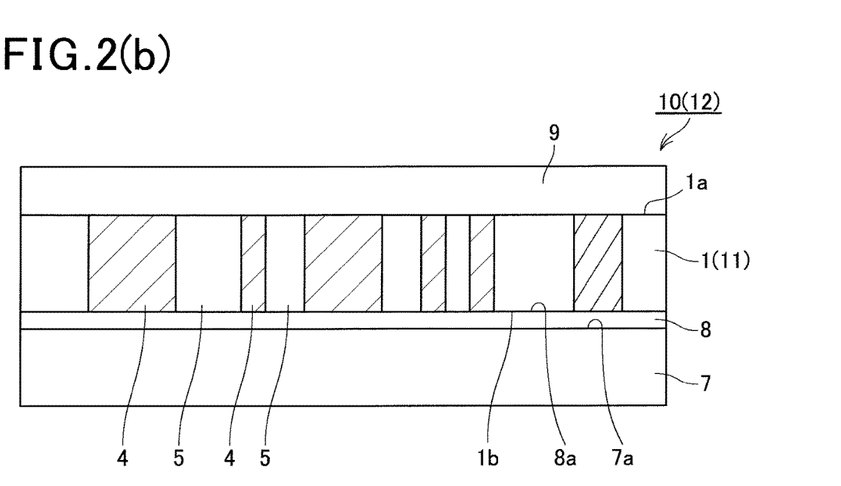

Then, as shown in FIG. 2(b), the crystal substrate 1 is formed on the seed crystal film 8 and a functional layer 9 is formed on the crystal substrate 1 to provide a functional device 10.

According to a preferred embodiment, the crystal substrate 1 is grown by flux method. In this case, the kind of the flux is not particularly limited, as far as it is possible to grow the nitride 11 of the group 13 element. According to a preferred embodiment, it is used a flux containing at least one of an alkali metal and alkaline earth metal, and flux containing sodium metal is particularly preferred.

A raw material of the nitride of the group 13 element is mixed to the flux and used. As the raw material, a single metal, an alloy and a compound are applicable, and the single metal of the group 13 element is suitably used from the viewpoint of handling.

In the case that the crystal substrate is produced by flux method, for promoting the vertical growth, the supersaturation degree is held at a low value and the flow of the melt is reduced, so that only the concentration gradient is utilized as the driving force for growing the crystal. The nucleation is restrained and the crystal is grown upwardly from nuclei.

Specifically, the crystal substrate is grown according to the following method.

(1A) The average growth temperature of the melt in the crucible is made high, so that the supersaturation degree is lowered to inhibit the formation of nuclei.

(2A) The temperature at an upper part of the crucible is made higher than that at a bottom part of the crucible so that flow in the melt is inhibited.

(3A) The melt is not agitated, or its agitation rate is made lower if agitated.

(4A) The partial pressure of a nitrogen-containing gas is made lower.

For example, the following conditions are applicable.

(1A) The average growth temperature of the melt in the crucible is made 870 to 885° C.

(2A) The temperature at the upper part in the crucible is made higher than that at the bottom part of the crucible by 0.5 to 1° C.

(3A) The melt is not agitated, or the agitation rate is made 30 rpm or smaller. Further, the direction of the agitation is fixed.

(4A) The partial pressure of the nitrogen-containing gas is made 3.5 to 3.8 MPa.

Under such conditions, a large number of crystal defects are present in the high carrier concentration regions. This is because, according to the structure of crystal grown upwardly and vertically in a shape of a pillar, the numbers of the carriers and crystal defects tend to increase in the sites with many dopants.

The crystal defects referred to herein means threading dislocations, including three kinds of dislocations: screw dislocation, edge dislocation and the mixed dislocations. These kinds of the dislocations can be confirmed by a transmission type electron microscope (TEM) or cathode luminescence (CL).

According to the flux method, a single crystal is grown in an atmosphere containing nitrogen-containing gas. For this gas, nitrogen gas may be preferably used, and ammonia may be used. Any other gas except the nitrogen-containing gas in the atmosphere is not limited; but an inert gas may be preferably used, and argon, helium, or neon may be particularly preferred.

It is preferred to hold for one hour or longer, more preferably two hours or longer, under the conditions (1A) to (4A) as described above.

It is further possible to perform growth stages under the following conditions (1B) to (4B), after the growth under the conditions of (1A) to (4A).

(1B) The average growth temperature of the melt in the crucible is made lower than that in the stage (1A). for example, the average growth temperature of the melt in the crucible may be made 850 to 865° C.

(2B) The temperature at the upper part of the crucible is made lower than the temperature at the bottom part of the crucible, so that the flow of the melt in the crucible is facilitated. For example, the temperature at the upper part of the crucible is made lower than the temperature at the bottom part of the crucible by 0.5 to 1° C.

(3B) The rate of the agitation of the melt is made 30 rpm or higher and the direction of the agitation is periodically changed.

(4B) The partial pressure of the nitrogen-containing gas is made higher than that at the stage (4A). For example, the partial pressure of the nitrogen-containing gas is made 3.9 to 4.2 MPa.

A ratio (molar ratio) of the nitride of the group 13 element/flux (for example, sodium) in the melt may preferably be made higher, preferably be 18 mol % or higher and more preferably be made 25 mol % or higher, on the viewpoint of the present invention. However, as this ratio becomes too high, the crystal quality tends to be deteriorated, so that the ratio may preferably be 40 mol % or lower.

(Vapor Phase Method)

For example, in the case of HVPE method, in initial stage of the growth, the mixed ratio of hydrogen is made higher (for example 50 percent or higher) so that the growth rate is made lower (for example, 10 to 20 microns/hr). The upward growth from the nuclei is thereby facilitated.

The nitride 11 of the group 13 element grown by flux method emits fluorescence (blue fluorescence) having a broad peak in a wavelength of 440 to 470 nm, in the case that it is irradiated light of a wavelength of 330 to 385 nm (for example light emitted from a mercury lamp). On the other hand, the nitride 11 of the group 13 element produced by a vapor phase process emits fluorescence (yellow fluorescence) having a broad peak in a wavelength of 540 to 580 nm, in the case that it is irradiated light of a wavelength of 330 to 385 nm. It is thereby possible to distinguish the nitride crystals of the group 13 element obtained by flux method and vapor phase process, based on the color of the fluorescence emitted by irradiating the light of a wavelength of 330 to 385 nm.

(Processing and Shape of GaN Substrate)

As shown in FIG. 2(b), the crystal substrate 1 is formed on the seed crystal film 8, and then a specific functional layer may be formed on the first main face 1a of the crystal substrate. Alternatively, the crystal substrate 1 may be removed from the seed crystal layer 8 by grinding, lift-of or the like to separate the crystal substrate 1 as shown in FIG. 1(a). In this case, the specific functional layer is formed on the first main face 1a of the separated crystal substrate 1. At this time, the second main face 1b of the crystal substrate may be subjected to polishing to reduce the warpage of the crystal substrate.

Alternatively, the surface 1a of the crystal substrate 1 is polished to provide a crystal substrate 2 having a polished first main face 2a, as shown in FIG. 1(b). Further, at this time, the second main face 1b of the crystal substrate 1 may be subjected to polishing to provide a crystal substrate 2 having a polished second main face 1b.

According to a preferred embodiment, the layer of the crystal of the nitride of the group 13 element has a shape of a circular plate, and it may have another shape such as a rectangular plate. Further, according to a preferred embodiment, the dimension of the gallium nitride substrate is of a diameter φ of 25 mm or larger. It is thereby possible to provide the crystal layer which is suitable for the mass production of functional devices and easy to handle.

It will be described below the cases of grinding and polishing the first and second main faces of the crystal substrate.

Grinding is that an object is contacted with fixed abrasives, obtained by fixing the abrasives by a bond and rotating at a high rotation rate, to grind a surface of the object. By such grinding, a roughed surface is formed. In the case that a bottom face of the crystal substrate is ground, it is preferably used the fixed abrasives containing the abrasives, composed of SiC. $Al_2O_3$, diamond, CBN (cubic boron nitride, same applies below) or the like having a high hardness and having a grain size of about 10 μm to 100 μm.

Further, lapping is that a surface plate and an object are contacted, while they are rotated with respect to each other, through free abrasives (it means abrasives which are not fixed, same applies below), or fixed abrasives and the object are contacted while they are rotated with respect to each other, to polish a surface of the object. By such lapping, it is formed a surface having a surface roughness smaller than that in the case of the grinding and larger than that in the case of micro lapping (polishing). It is preferably used abrasives composed of SiC. $Al_2O_3$, diamond, CBN or the like having a high hardness and having a grain size of about 0.5 μm or larger and 15 μm or smaller.

Micro lapping (polishing) means that a polishing pad and an object are contacted with each other through free abrasives while they are rotated with each other, or fixed abrasives and the object are contacted with each other while they are rotated with each other, for subjecting a surface of the object to micro lapping to flatten it. By such polishing, it is possible to obtain a crystal growth surface having a surface roughness smaller than that in the case of the lapping.

EXAMPLES

Example 1

The crystal substrate 2 and horizontal type light emitting device 12 were produced, according to the procedure described referring to FIGS. 1 and 2.

(Production of a Seed Crystal Substrate)

A low-temperature GaN buffer layer was deposited in 20 nm at 530° C. using MOCVD method, on a c-plane sapphire substrate 7 having a diameter of 2 inches and a thickness of 500 μm. A seed crystal film 8 made of GaN and having a thickness of 2 μm was deposited thereon at 1050° C. The defect density observed by TEM (transmission type electron microscope) was proved to be $1 \times 10^9/cm^2$. The obtained assembly was subjected to ultrasonic washing with organic solvent and ultra-pure water for 10 minutes, respectively, and then dried to obtain a seed crystal substrate.

(Growth of Crystal Substrate)

In a glove box filled with an inert gas, Ga metal and Na metal were weighed in a molar ratio of 20:80 and then placed on a bottom of an alumina crucible with the seed crystal substrate. Further, as a dopant, liquid germanium was added thereto in an amount of 1 mol/cm$^3$ with respect to Ga. Three crucibles were staked, and an alumina lid was mounted on the top of the three crucibles. These were contained in a holding container (reaction container) of stainless steel. Four reaction containers, each containing the stack of the crucibles, were stacked and then contained in a holding container (inner container) made of a stainless steel.

Then, heaters provided in a pressure container were heated to melt raw materials in the crucibles to generate Ga—Na mixed melts. While the crucibles were heated to maintain the temperature at 880° C., nitrogen gas was supplied from a nitrogen gas bombe until a pressure of 3.8 MPa to initiate the crystal growth. Five hours later, the temperature in the crucible was lowered to 850° C. over 20 hours and the pressure was changed to 4.0 MPa. At this time, the agitation was performed by inverting the rotational direction of the rotational table continuously to grow the crystal. As to the conditions of the rotation, the rotational table was rotated around a central axis at a rate of 30 rpm clockwise and anti-clockwise at a specific interval. The time period for acceleration was made 6 seconds, the holding time was made 200 seconds, the rate-decreasing time was made 6 seconds and the stopping time was made 1 second. Such condition was held for 24 hours. The thickness of the GaN crystal was increased by about 300 microns.

The surface 1a of the thus obtained crystal substrate 1 was subjected to polishing to make the thickness 150 microns. The density of dark spots in a region of 100 microns and 100 microns on the surface was measured by cathode luminescence (it is abbreviated as CL below) and proved to be $2 \times 10^5/cm^2$. The density of the dark spots was deemed as the defect density. A sample was cut out from the crystal substrate in dimensions of 6 mm×6 mm, and the samples was subjected to hole measurement to obtain the carrier density, which was proved to be $5 \times 10^{18}/cm^3$.

Further, light of a wavelength of 330 to 385 nm was irradiated from a mercury lamp to the thus obtained gallium nitride crystal substrate. It was oscillated fluorescence (blue fluorescence) having a broad peak at 440 to 470 nm.

(Production of a Wafer)

Thereafter, the substrate was subjected to laser lift-off so that the supporting substrate 7 and seed crystal substrate 8 were separated from the crystal substrate 1. Both faces 1a and 1b of the crystal substrate 1 were subjected to mechanical processing and dry etching to perform the flattening to obtain a 2-inch wafer (crystal substrate) 2 having a thickness of 250 μm.

The cross sectional structure of the crystal substrate 2 was observed by CL. As a result, the cross section was divided into bright regions 5 and dark regions 4. Each of the regions was grown in a stripe shape in the cross section. Further, dark lines due to concentration of dislocations were observed in the central part of the bright region 5. The bright region 5 has a defect density of 2 to $5 \times 10^8/cm^2$ and a carrier concentration of $1 \times 10^{19}/cm^3$. The region 4 of a lower luminous intensity has a substantially uniform defect density of $2 \times 10^6/cm^2$ and a carrier concentration of $5 \times 10^{17}/cm^3$.

The carrier concentration was measured as follows. CL measurement was carried out for five samples whose carrier concentrations are measured in advance by eddy current system ($1 \times 10^{17}/cm^3$; $5 \times 10^{17}/cm^3$; $1 \times 10^{18}/cm^3$; $5 \times 10^{18}/cm^3$; $1 \times 10^{19}/cm^3$). The brightness of each of the corresponding images was subjected to image processing in 8 bits (255 gradations) to provide a calibration line concerning the carrier density and brightness of the CL image. The thus obtained calibration line was used to calculate the carrier concentration.

(Production of Light Emitting Device)

The thus obtained crystal substrate was used to produce an LED structure by MOCVD method. Electrodes were then patterned and the back face was polished so that the thickness of the crystal substrate after the back-polishing was made 70 microns. It was then produced a blue LED having a dimensions of 1 mm×1 mm by dicing and of the horizontal type structure. The internal quantum efficiency was measured at a driving current of 350 mA and proved to be as high as about 80 percent. The luminous intensity was uniform over the plane. Further, the driving current was raised to 1000 mA and the internal quantum efficiency was measured to prove to be as high as 65 percent. Further, the leak current at an application voltage of 2V was as low as 5 nA.

Further, the thus obtained crystal substrate was used to produce an LED structure by MOCVD method. Electrodes were then patterned and the back face was polished so that the thickness of the crystal substrate after the back-polishing was made 70 microns. It was then produced a blue LED having a dimensions of 1 mm×1 mm by dicing and of the vertical type structure.

The internal quantum efficiency of the thus obtained LED of vertical type was measured at a driving current of 350 mA and proved to be as high as about 75 percent. However, the luminous intensity was not uniform over the plane, for the thus obtained vertical type LED device. Further, the driving current was raised to 1000 mA and the internal quantum efficiency was measured. As a result, it was lowered to 55 percent and the deviation of the luminous intensity became more considerable. The leak current at an application voltage of 2V was as large as 0.1 μA.

Based on the experimental results described above, it was understood that the defect concentration regions in the regions 5 of bright luminescence in the underlying layer was the cause of the leak current.

Example 2

The seed crystal substrate was obtained according to the procedure same as that in the Example 1. The crystal substrate was produced on the seed crystal substrate by vapor phase process.

(GaN Crystal Growth by Vapor Phase Process)

Gallium (Ga) and hydrogen chloride (HCl) were reacted with each other to produce GaCl. The gallium nitride crystal was grown by hydride vapor phase epitaxy using GaCl as the raw material of III group and ammonia ($NH_3$) as the raw material of group V. The seed crystal substrate was set in a growing system of hydride vapor phase epitaxy, and the growth temperature was raised to 1000° C. under ammonia atmosphere. After the growth temperature was stabilized, HCl was supplied at a flow rate of 40 cc/min, and n-type GaN crystal was grown while $NH_3$ was supplied at a flow rate of 1000 cc/min and silane ($SiH_4$) was supplied at a flow rate of 0.01 cc/min.

It was maintained for 4 hours at the state, and it was cooled to room temperature under ammonia gas atmosphere. The GaN crystal was then drawn out of the growing system to prove that the GaN crystal was grown in about 300 microns.

The surface 1a of the thus obtained crystal substrate 1 was subjected to polishing until the thickness was made 250 microns. The density of dark spots on the surface was measured by CL method and proved to be $8\times10^6/cm^2$. The density of the dark spots was deemed as the defect density. A sample was cut out from the crystal substrate in dimensions of 6 mm×6 mm, and the samples was subjected to hole measurement to obtain the carrier density, which was proved to be $5\times10^{18}/cm^3$.

(Production of Wafer)

Thereafter, the substrate was subjected to laser lift-off so that the supporting substrate 7 and seed crystal substrate 8 were separated from the crystal substrate 1. Both faces 1a and 1b of the crystal substrate 1 were subjected to mechanical processing and dry etching to perform the flattening to obtain a 2-inch wafer (crystal substrate) 2 having a thickness of 250 μm.

The cross sectional structure of the crystal substrate 2 was observed by CL. As a result, the cross section was divided into bright regions 5 and dark regions 4. Each of the regions was grown in a stripe shape in the cross section. Further, dark lines due to concentration of dislocations were observed in the central part of the bright region 5. The bright region 5 has a defect density of $2\times10^8/cm^2$ and a carrier concentration of $2\times10^{19}/cm^3$. The region 4 of a lower luminous intensity has a substantially uniform defect density of $5\times10^5/cm^2$ and a carrier concentration of $8\times10^{17}/cm^3$.

Further, light of a wavelength of 330 to 385 nm was irradiated from a mercury lamp to the thus obtained gallium nitride crystal substrate. It was oscillated fluorescence (yellow fluorescence) having a broad peak at 540 to 580 nm.

(Production of Light Emitting Device)

The thus obtained crystal substrate was used to produce an LED structure by MOCVD method. Electrodes were then patterned and the back face was polished so that the thickness of the crystal substrate after the back-polishing was made 70 microns. It was then produced a blue LED having dimensions of 1 mm×1 mm by dicing and of the horizontal type structure. The internal quantum efficiency was measured at a driving current of 350 mA and proved to be as high as about 80 percent. The luminous intensity was uniform over the plane. Further, the driving current was raised to 1000 mA and the internal quantum efficiency was measured to prove to be as high as 65 percent. Further, the leak current at an application voltage of 2V was as low as 5 nA.

Further, the thus obtained crystal substrate was used to produce an LED structure by MOCVD method. Electrodes were then patterned and the back face was polished so that the thickness of the crystal substrate after the back-polishing was made 70 microns. It was then produced a blue LED having a dimensions of 1 mm×1 mm by dicing and of the vertical type structure.

The internal quantum efficiency of the thus obtained LED device of vertical type was measured at a driving current of 350 mA and proved to be as high as about 75 percent. However, the luminous intensity was not uniform over the plane. Further, the driving current was raised to 1000 mA and the internal quantum efficiency was measured. As a result, it was lowered to 55 percent and the deviation of the luminous intensity became more considerable. The leak current at an application voltage of 2V was as large as 1 μA.

The invention claimed is:

1. A crystal substrate comprising a crystal of a nitride of a group 13 element and having a first main face and a second main face:
   wherein said crystal substrate comprises a low carrier concentration region and a high carrier concentration region both extending between said first main face and said second main face;
   wherein said low carrier concentration region has a carrier concentration of $10^{18}/cm^3$ or lower;
   wherein said low carrier concentration region has a defect density of $10^7/cm^2$ or lower;
   wherein said high carrier concentration region has a carrier concentration of $10^{19}/cm^3$ or higher;
   wherein said high carrier concentration region has a defect density of $10^8/cm^2$ or higher; and
   wherein said low carrier concentration region and said high carrier concentration region are alternately provided and adjacent to each other.

2. The crystal substrate of claim 1, wherein said crystal substrate has a thickness of 250 μm or larger and 450 μm or smaller.

3. The crystal substrate of claim 1, wherein said crystal of said nitride of said group 13 element comprises a crystal emitting fluorescence having a peak in a wavelength range of 440 to 470 nm or 540 to 580 nm when a light having a wavelength of 330 to 385 nm is irradiated to said crystal.

4. The crystal substrate of claim 1, wherein said first main face of said crystal substrate is a polished surface.

5. The crystal substrate of claim 1, wherein said crystal of said nitride of said group 13 element forming said crystal substrate comprises gallium nitride.

6. A functional device comprising:
said crystal substrate of claim 1; and
a functional layer comprising a nitride of a group 13 element and formed on said crystal substrate.

7. The functional device of claim 6, wherein said functional layer has a function of emitting a light.

8. The functional device of claim 7, comprising a horizontal type light emitting device,
wherein said functional layer is provided on said first main face; and
wherein said horizontal type light emitting device comprises at least a pair of electrodes provided on said first main face.

9. A functional device comprising:
a crystal substrate comprising a crystal of a nitride of a group 13 element and having a first main face and a second main face; and
a functional layer having a function of emitting light, comprising a nitride of a group 13 element and formed on said crystal substrate,
wherein said functional layer having said function of emitting light is provided on said first main face of said crystal substrate;
wherein said functional device comprises at least a pair of electrodes provided on said first main face;
wherein said crystal substrate comprises a low carrier concentration region and a high carrier concentration region both extending between said first main face and said second main face;
wherein said low carrier concentration region has a carrier concentration of $10^{18}/cm^3$ or lower;
wherein said low carrier concentration region has a defect density of $10^7/cm^2$ or lower;
wherein said high carrier concentration region has a carrier concentration of $10^{19}/cm^3$ or higher; and
wherein said high carrier concentration region has a defect density of $10^8/cm^2$ or higher.

10. The functional device of claim 9, wherein said crystal substrate has a thickness of 250 μm or larger and 450 μm or smaller.

11. The functional device of claim 9, wherein said crystal of said nitride of said group 13 element comprises a crystal emitting fluorescence having a peak in a wavelength range of 440 to 470 nm or 540 to 580 nm when a light having a wavelength of 330 to 385 nm is irradiated to said crystal.

12. The functional device of claim 9, wherein said first main face of said crystal substrate is a polished surface.

* * * * *